United States Patent
Morrish

[19]

[11] Patent Number: 6,163,211
[45] Date of Patent: Dec. 19, 2000

[54] CASCODE AMPLIFIER WITH POSITIVE FEEDBACK FOR HIGH FREQUENCY PERFORMANCE AND METHOD FOR OPERATING AND OPTIMIZING SUCH AMPLIFIER

[75] Inventor: Andrew J. Morrish, Saratoga, Calif.

[73] Assignee: National Semiconductor Corporation, Santa Clara, Calif.

[21] Appl. No.: 09/492,043

[22] Filed: Jan. 26, 2000

Related U.S. Application Data

[62] Division of application No. 09/267,527, Mar. 12, 1999.

[51] Int. Cl.[7] ............................... H03F 1/24; H03F 3/04
[52] U.S. Cl. ............................... 330/98; 330/99; 330/311
[58] Field of Search ............................... 330/98, 99, 100, 330/151, 310, 311

[56] References Cited

U.S. PATENT DOCUMENTS

| | | | |
|---|---|---|---|
| 4,622,498 | 11/1986 | Lester | 330/311 |
| 5,185,582 | 2/1993 | Barbu | 330/311 |
| 5,453,798 | 9/1995 | White et al. | 348/692 |
| 5,986,502 | 11/1999 | Nakamura | 330/311 |

OTHER PUBLICATIONS

"LM2405 Monolithic Triple 7 ns CRT Driver," National Semiconductor Corporation, Aug. 1996 (pp 1–6).

*Primary Examiner*—Benny Lee
*Assistant Examiner*—Patricia T. Nguyen
*Attorney, Agent, or Firm*—Limbach & Limbach, L.L.P.

[57] ABSTRACT

A cascode amplifier which includes a cascode amplifier stage, an output node (coupled directly or indirectly to the cascade amplifier stage), and positive feedback circuitry coupled between the output node and the cascade amplifier stage (or positive feedforward circuitry coupled between the input node and the cascade amplifier stage) for improved amplifier response to rapidly varying input. Preferably, the amplifier is implemented as an integrated circuit or portion of an integrated circuit, and the feedback or feedforward circuitry is configured to reduce rise times and fall times of the output potential (in response to falling and rising edges of the input) to within acceptable limits, with no more than acceptably small overshoot at both the rising and falling edges of the output potential, and with at least substantially equal overshoot at both the rising and falling edges of the output potential. Preferably, the feedback circuitry is configured to provide relatively less positive feedback to the cascode amplifier stage at each rising edge of the output than at each falling edge of the output, with the feedback preferably being a feedback current that flows to or from a capacitor coupled to the output node. Preferably, the feedback circuitry steers away from the cascade amplifier stage a portion of a feedback current while the output rises and steers no part of the feedback current away from the cascode amplifier stage while the output falls. Other aspects of the invention are methods for operating such an amplifier, and for designing such an amplifier to have optimized response to a rapidly varying input.

11 Claims, 6 Drawing Sheets

CASCODE AMPLIFIER WITH POSITIVE FEEDBACK FOR HIGH FREQUENCY PERFORMANCE AND METHOD FOR OPERATING AND OPTIMIZING SUCH AMPLIFIER

This is a continuation of Application Ser. No. 09/267,527, filed Mar. 12, 1999.

BACKGROUND OF THE INVENTION

1. Field of the Invention

The present invention relates generally to integrated circuit implementations of high-speed amplifiers, and more particularly to integrated circuit cascode amplifiers which include feedback or feedforward circuitry for improved amplifier response to rapidly varying input signals.

2. Description of the Related Art

Figure 1:
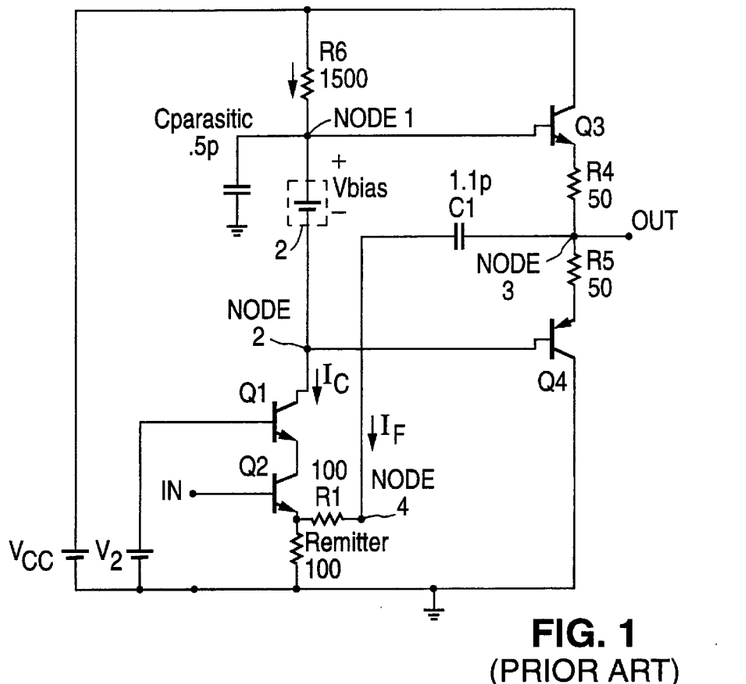
FIG. 1 is a schematic diagram of a conventional cascode amplifier with positive feedback circuitry for high frequency performance.

FIG. 1 is a schematic diagram of a conventional high-speed cascode amplifier. The circuit asserts amplified output potential "OUT" (at Node 3) in response to input potential "IN" at the base of NPN bipolar transistor Q2, when biased by bias potentials $V_{bias}$ and $V_2$ (with supply voltage Vcc applied across its top and bottom rail). The amplifier of FIG. 1 is typically implemented as an integrated circuit (or portion of an integrated circuit). Such an integrated circuit implementation will be assumed in the following description.

Typically, the output of the FIG. 1 amplifier drives a capacitive load (e.g., the R, G, or B cathode of a CRT color monitor), the supply potential $V_{cc}$ is in the range 60V to 85V (above ground), bias potential $V_2$ is in the range from about 8V to 15V above ground, and input potential IN is an analog signal in the range from 0V to 6V above ground. The FIG. 1 amplifier can also drive a resistive load.

The amplifier of FIG. 1 includes a cascode amplifier stage comprising NPN bipolar transistors Q1 and Q2 (connected as shown with the base of Q1 at bias potential $V_2$, the collector of Q1 at Node 2, the emitter of Q1 connected to the collector of Q2, and the emitter of Q2 connected through resistor $R_{emitter}$ to ground). Resistor R6 is connected between the top rail and Node 1. Node 1 is maintained at a potential $V_{bias}$ above Node 2 by circuit element 2.

Figure 1A:
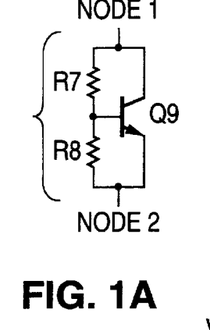
FIG. 1A is a schematic diagram of a typical implementation of circuit element 2 of the amplifier of FIG. 1.

FIG. 1A is a typical implementation of circuit element 2, which comprises resistors R7 and R8 connected in series between Nodes 1 and 2, and NPN bipolar transistor Q9 connected with its base between resistors R7 and R8 as shown in FIG. 1A. Transistor Q9 provides biasing to output driver transistors Q3 and Q4, to reduce crossover distortion at low signal levels.

NPN bipolar transistor Q3 and PNP bipolar transistor Q4 are emitter followers which buffer the amplifier's output, isolating the amplifier's high output impedance from the load (e.g., from the capacitance of a CRT cathode). Resistor R4 is connected between output node 3 and the emitter of Q3, and resistor R5 is connected between output node 3 and the emitter of Q4. Alternatively, compound emitter followers (such as a Darlington configuration) can be used to drive the amplifier's output.

The feedback path comprising capacitor C1 and resistor R1 between output node 3 and the emitter of transistor Q2 provides positive feedback to improve high frequency performance and to compensate for parasitic capacitance at the output of the cascode amplifier stage. Small capacitor C1 (having typical capacitance 1.1 picoFarads as indicated in FIG. 1) provides additional current into the emitter of cascode transistor Q2, which acts to reinforce the current source action of transistor Q2 at high frequencies.

We next describe the operation of the FIG. 1 amplifier. In response to an increase in the input potential IN, the collector current of Q2 increases, and thus the collector current $I_C$ of Q1 increases and the current through resistor R6 increases. Thus, the potentials at Nodes 1 and 2 fall, the emitter potentials of Q3 and Q4 fall, and thus the output potential OUT at Node 3 falls. At the same time, feedback current $I_F$ flows from the emitter of Q2 through resistor R1 to capacitor C1. Thus, the current $I_F$ provides positive feedback, which increases the total current $I_C$ flowing into the collector of transistor Q1 (above the value it would have if R1 were replaced by an open circuit).

In response to a decrease in the input potential IN of the FIG. 1 amplifier, the collector current of Q2 decreases, and thus the collector current $I_C$ of Q1 decreases and the current through resistor R6 decreases. Thus, the potentials at Nodes 1 and 2 rise, the emitter potentials of Q3 and Q4 rise, and thus the output potential OUT at Node 3 rises. At the same time, feedback current $I_F$ flows to the emitter of Q2 from capacitor C1 through resistor R1. The current $I_F$ provides positive feedback, which decreases the total current $I_C$ flowing into the collector of Q1 (below the value it would have if R1 were replaced by an open circuit).

However, the amount of positive feedback (i.e., the amplitude of current $I_F$) needed by the FIG. 1 amplifier to achieve a given level of overshoot in the output OUT (in response to a rising or falling edge of input IN) is different for a rising edge than for a falling edge of the output OUT. This asymmetry is apparent from FIG. 2.

Figure 2:
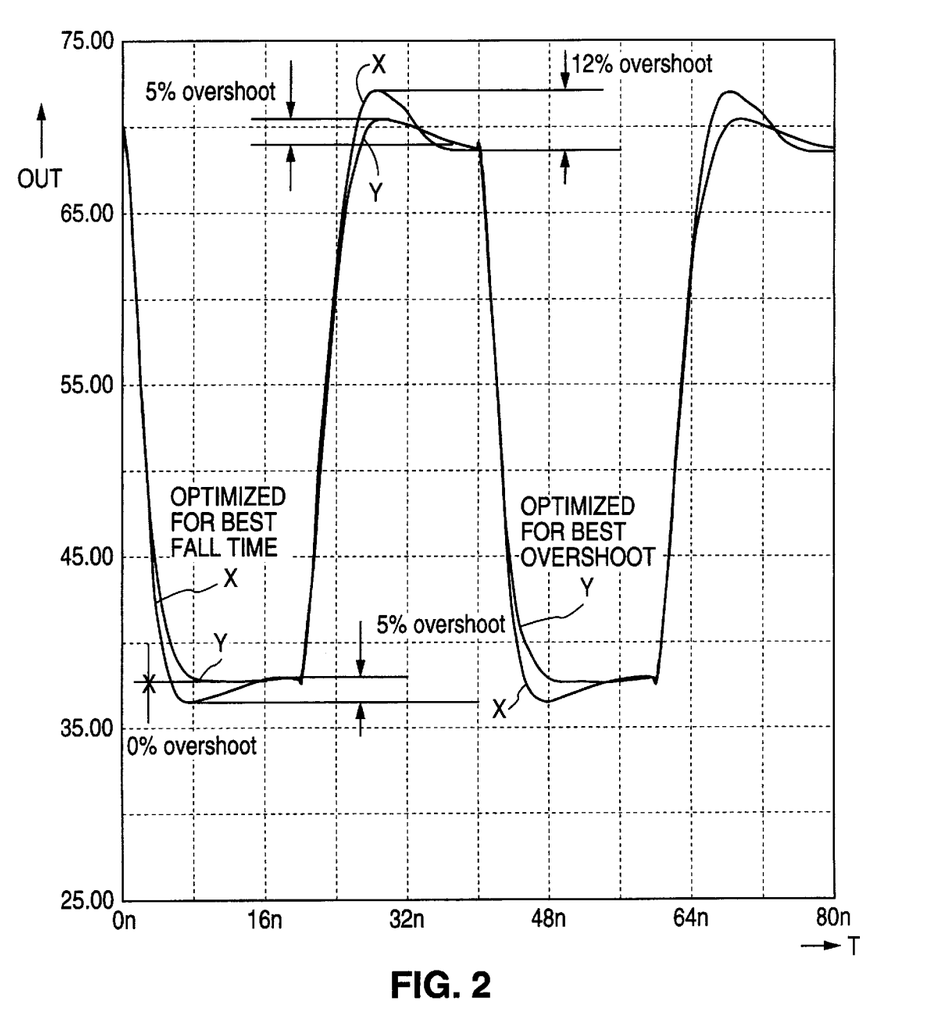
FIG. 2 is a graph of the output of the FIG. 1 amplifier in response to a square wave input, for each of two different capacitance values of capacitor C1.

In FIG. 2, the vertical axis represents the output potential OUT (in volts) produced in response to a square wave input signal (having period 40 nsec). The horizontal axis represents time (from t=0 to t=80 nsec). Curve X assumes a value of capacitance for capacitor C1 which optimizes (minimizes) the fall time for the output potential (in response to a rising edge of the input potential), and curve Y assumes a lesser capacitance for capacitor C1 which optimizes (minimizes) the overshoot of the output potential in response to a rising or falling edge of the input potential).

As apparent from FIG. 2, in order to minimize fall time of the output potential, substantial overshoot must be tolerated at both the rising and falling edges of the output potential. The overshoot at each falling edge of the output potential is about 5%, and the overshoot at each rising edge of the output potential is significantly greater (about 12%).

When the capacitance of C1 is sufficiently reduced to minimize overshoot (as represented by curve Y, with only about 5% overshoot at each rising edge and no overshoot at each falling edge of the output potential), long rise and fall times must be tolerated.

It would be desirable to implement an integrated circuit cascode amplifier (with feedback circuitry for improved amplifier response to rapidly varying input) such that the feedback circuitry allows both rise and fall times of the output (in response to falling and rising edges of the input) to be minimized, with no more than a tolerably small overshoot at the rising edges as well as falling edges of the output potential, and preferably with at least substantially equal overshoot at the rising and falling edges of the output potential. Until the present invention, it had not been known how to do so.

SUMMARY OF THE INVENTION

In a class of embodiments, the invention is a cascode amplifier which includes a cascode amplifier stage, an output node (coupled directly or indirectly to the cascode amplifier stage), and positive feedback circuitry coupled between the output node and the cascode amplifier stage for improved amplifier response to rapidly varying input. In other embodiments, the invention is a cascode amplifier which includes a cascode amplifier stage, an output node (coupled to the cascode amplifier stage), and positive feedforward circuitry coupled between the input node and the cascode amplifier stage for improved amplifier response to rapidly varying input. In preferred embodiments, the invention is implemented as an integrated circuit or portion of an integrated circuit. The positive feedback or feedforward circuitry is configured to reduce rise times and fall times of the output potential (in response to falling and rising edges of the input) to within acceptable limits, with no more than acceptably small overshoot at both the rising and falling edges of the output potential, and with equal (or substantially equal) overshoot at both the rising and falling edges of the output potential.

In a class of preferred embodiments, the feedback (or feedforward) circuitry is configured to provide relatively less positive feedback (feedforward) to the cascode amplifier stage at each rising edge of the output than at each falling edge of the output, with the feedback preferably being a feedback current that flows to or from a capacitor coupled to the output node, and the feedforward preferably being a feedforward current that flows to or from a capacitor coupled (directly or indirectly) to the input node. Preferably, the feedback (feedforward) circuitry accomplishes this by steering away from the cascode amplifier stage a portion of a feedback (feedforward) current while the output rises and steering no part of the feedback (feedforward) current away from the cascode amplifier stage while the output falls.

Another aspect of the invention is a method for operating an amplifier in which positive feedback is provided from an output node (or positive feedforward is provided from an input node) to a cascode amplifier stage to improve the amplifier response to a rapidly varying input, wherein relatively less positive feedback (or feedforward) is provided to the cascode amplifier stage while the output potential at the output node increases, and relatively more positive feedback (or feedforward) is provided to the cascode amplifier stage while the output potential at the output node decreases. In preferred embodiments, the feedback is feedback current which flows to or from a capacitor coupled to the output node, part of this current is steered away from the cascode amplifier stage (and the remaining portion is steered to the cascode amplifier stage) while the output rises, and no part of the feedback current is steered away from the cascode amplifier stage while the output falls, so that the overshoot of the output potential in response to a rising edge of the input is equal or substantially equal to the overshoot of the output potential in response to a falling edge of the input.

Another aspect of the invention is a method for designing an amplifier to have optimized response to a rapidly varying input, where the amplifier includes feedback circuitry connected between an output node and a cascode amplifier stage, the feedback circuitry including a capacitor coupled to the output node, a first branch coupled between the capacitor and the cascode amplifier stage, and a second branch having a first state in which it steers current from the first branch and a second state in which it does not steer current from the first branch. This method includes the steps of: determining a capacitance of the capacitor, parameters of the first branch, and candidate parameters of the second branch which result in acceptably small rise times and fall times of the output potential (in response to falling and rising edges of the input) with no more than an acceptably small overshoot at each falling edge of the output potential; and (assuming that the feedback circuit is implemented with the capacitor having said capacitance and the first branch having said parameters) determining parameters of the second branch which cause the feedback circuitry produce no more than said acceptably small overshoot at each rising edge of the output potential. Another aspect of the invention is a method for designing an amplifier to have optimized response to a rapidly varying input, where the amplifier includes feedforward circuitry connected between an input node and a cascode amplifier stage, the feedforward circuitry including a capacitor branch (e.g., capacitor C1 and buffer B of FIG. 8) coupled to the input node, a first branch coupled between the capacitor branch and the cascode amplifier stage, and a second branch having a first state in which it steers current from the first branch and a second state in which it does not steer current from the first branch.

DETAILED DESCRIPTION OF THE PREFERRED EMBODIMENTS

Figure 3:
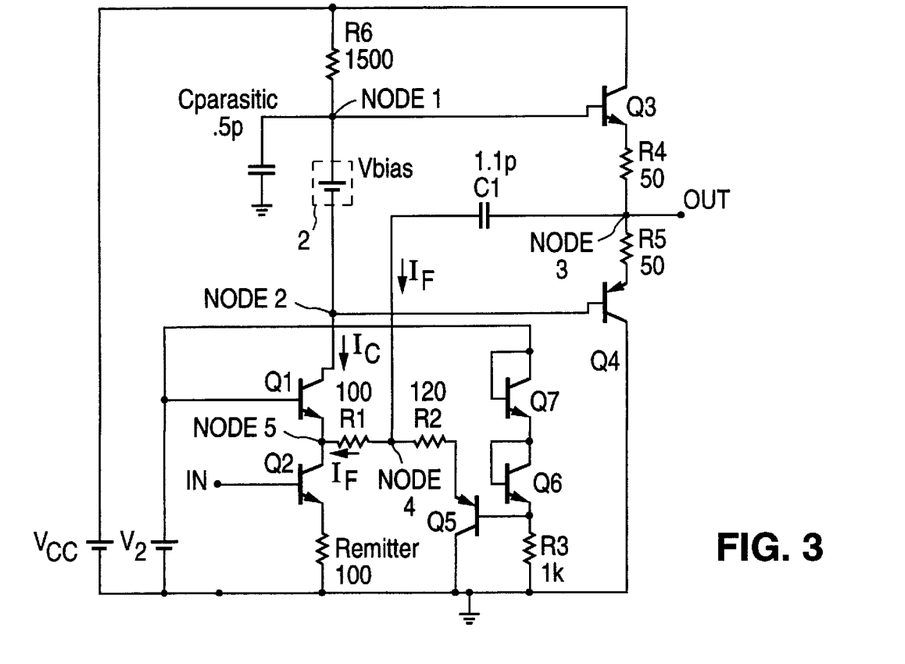
FIG. 3 is a schematic diagram of a cascode amplifier implemented in accordance with a preferred embodiment of the invention.

A preferred embodiment of the invention will be described with reference to FIG. 3. The amplifier of FIG. 3 is identical to that of FIG. 1, except in that the feedback circuitry of FIG. 3 includes resistor R2 and PNP bipolar transistor Q5 (connected between node 4 and ground as shown) and diode connected NPN bipolar transistors Q7 and Q6 and resistor R3 connected as shown between the base of transistor Q1 and ground, whereas the feedback circuitry of FIG. 1 does not include elements R2, Q5, Q7, Q6, and R3. Components of the FIG. 3 amplifier which correspond (and are identical) to components of the FIG. 1 amplifier are identically numbered in FIGS. 1 and 3, and the description of them provided above will not be repeated with reference to FIG. 3. The amplifier of FIG. 3 is typically implemented as an integrated circuit (or portion of an integrated circuit). Such an integrated circuit implementation will be assumed in the following description.

The FIG. 3 amplifier includes a cascode amplifier stage (comprising transistors Q1 and Q2, resistors R6 and $R_{emittert}$, and biasing circuitry for providing bias voltages $V_{bias}$ and $V_2$), an output buffer stage (comprising transistors Q3 and Q4 and resistors R4 and R5), and positive feedback circuitry (comprising capacitor C1, resistors R1, R2, and R3, and transistors Q5, Q6, and Q7) for improved amplifier response to a rapidly varying input. The positive feedback circuitry is configured so that by choosing appropriate values for C1, R1, R2, and R3, and the potential at the base of Q5, the rise and fall times of the output potential OUT (in response to falling and rising edges of input IN) can be minimized, with no more than an acceptably small overshoot at the rising edges as well as the falling edges of the output potential, and with the overshoot being the same (or at least substantially the same) at the rising and falling edges of the output potential.

Although the output node of FIG. 3 (Node 3) is coupled indirectly (through the output buffer stage) to the cascode amplifier stage, in variations on the FIG. 3 circuit the output node of the inventive amplifier is coupled directly to the output of the cascode amplifier stage (i.e., the output node is the output of the cascode amplifier stage).

In FIG. 3, clamping transistor Q5 is biased at a DC level (by diode-connected transistors Q6 and Q7 connected between the base of Q1 and the base of Q5) so that the collector of Q5 is at the same potential as the emitter of Q1. In some variations on the FIG. 3 embodiment, individual transistor junctions provide the desired DC potential difference between the base of Q1 and the base of Q5, and in other variations a transistor diode voltage multiplier provides this DC potential difference. The characteristics of R3, Q6, and Q7 are chosen so that there is no significant potential difference between the emitter of Q1 and the emitter of Q5 (and so that any potential difference between the emitters of Q1 and Q5 is well controlled and constant with temperature, due to the close matching of the diode junctions in the circuit). Because the potential difference between the emitters of Q1 and Q5 is nominally zero, little or no DC current flows through resistors R1 and R2.

In response to an increase in the input potential IN at the base of transistor Q2 of FIG. 3, the collector current of Q2 increases, and thus the collector current $I_C$ of Q1 increases and the current through resistor R6 increases. Thus, the potentials at Nodes 1 and 2 fall, the emitter potentials of Q3 and Q4 fall, and the output potential OUT at Node 3 falls. The falling potential at Node 4 reverse biases the emitter-base junction of transistor Q5 (so that no current flows through resistor R2), and also causes current (feedback current $I_F$) to flow from the emitter of Q1 through resistor R1 to capacitor C1 (to discharge capacitor C1). The current $I_F$ represents provides positive feedback which increases the total current $I_C$ flowing into the collector of transistor Q1 (above the value it would have if R1 were replaced by an open circuit). The capacitance of capacitor C1 can be chosen (during design of a specific implementation of the FIG. 3 circuit) to optimize the amount of feedback, in order to minimize the fall time of output potential OUT and minimize the overshoot of each falling edge of output potential OUT.

In response to a decrease in the input potential IN of the FIG. 3 embodiment, the collector current of Q2 decreases, and thus the collector current $I_C$ of Q1 decreases and the current through resistor R6 decreases. Thus, the potentials at Nodes 1 and 2 rise, the emitter potentials of Q3 and Q4 rise, and thus the output potential OUT at Node 3 rises. At the same time, feedback current $I_F$ flows from capacitor C1 to Node 4. A portion (feedback current $I'_F$) of current $I_F$ flows from Node 4 through resistor R1 to the emitter of transistor Q1. The remaining portion of current $I_F$ flows from Node 4 through resistor R2 and transistor Q5 to ground. The current $I'_F$ provides positive feedback, which decreases the total current $I_C$ flowing into the collector of Q1 (below the value it would have if R1 were replaced by an open circuit).

Depending on the value of the resistance ratio R1/R2, more or less of current $I_F$ is steered away from the cascode amplifier stage (at each rising edge of the output potential OUT). By selecting different values of resistance R2 to achieve an appropriate ratio R1/R2 during design of a specific implementation of the FIG. 3 circuit (assuming that values of capacitor C1 and resistor R1, and a candidate value of R1, have been selected to achieve acceptably low rise time and fall time of the output and acceptable overshoot at each falling edge of the output), the amount of overshoot at each rising edge of the output can be controlled to have an acceptable value without significantly changing the rise and fall time and the overshoot at each falling edge of the output. The latter point is apparent from FIG. 4.

Figure 4:
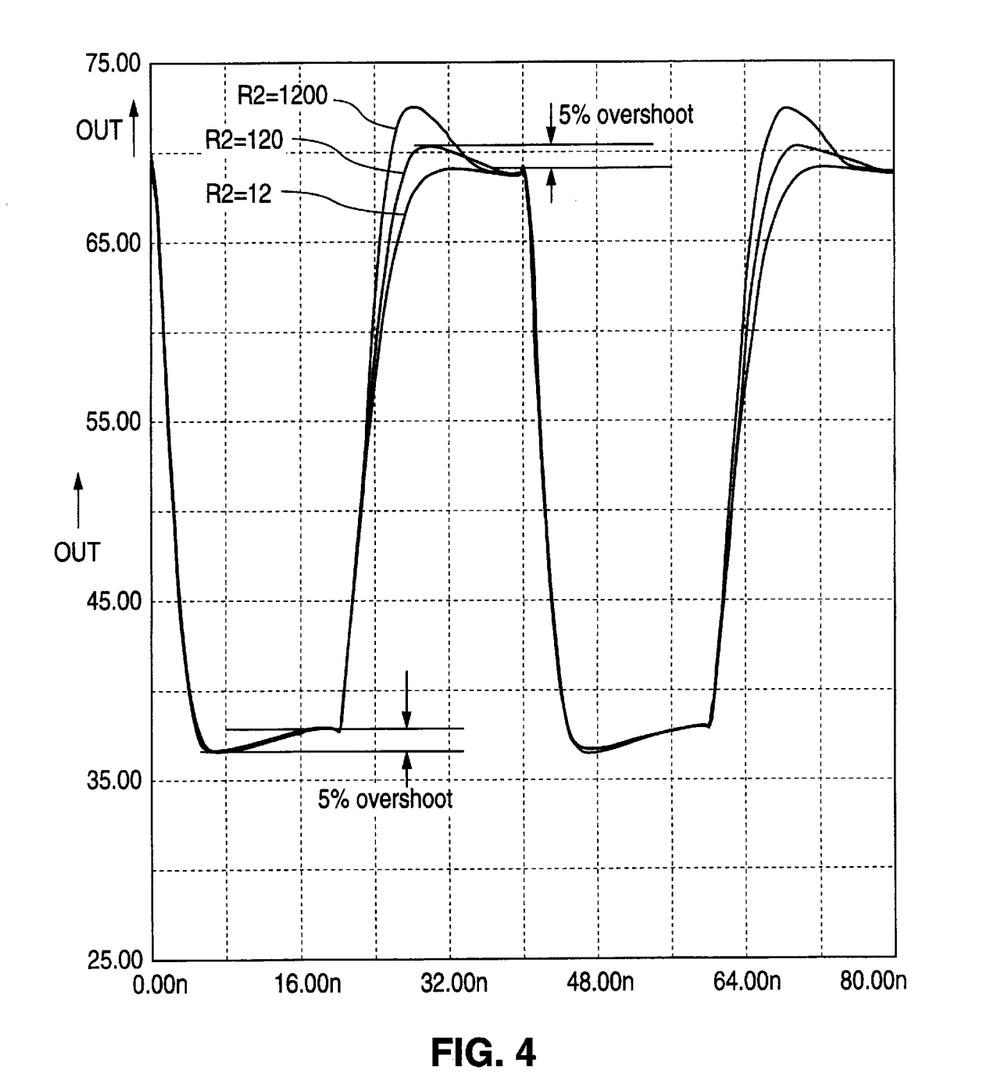
FIG. 4 is a graph of the output of the FIG. 3 amplifier in response to a square wave input, for each of several resistance values of resistor R2.

FIG. 4 is a graph of the output (OUT) of the FIG. 3 amplifier in response to a square wave input for each of several resistance values of resistor R2 (and the values, 1.1 picoFarad and 100 Ohms respectively, of C1 and R1 that are indicated in FIG. 3). As apparent from FIG. 4, a value of 1200 Ohms for R2 undesirably results in excessive (greater than 5%) overshoot at each rising edge of the output, and a value of 12 Ohms for R2 undesirably results in excessively long rise times of the output (although it desirably results in less than 5% overshoot at each rising edge of the output). Selecting a value of R2=120 ohm achieves 5% overshoot at each rising edge with acceptably low rise and fall times. Thus, in designing a specific implementation of the FIG. 3 circuit, the designer could initially pick the following component values: C1=1.1 picoFarad, R1=100 Ohms, and R2=1200 Ohms (to achieve acceptably low rise and fall times of the output in response to a square wave input, and acceptable overshoot at each falling edge of the output). Then, the designer could experimentally determine (e.g., as a result of simulations) a reduced value of resistor R2 (i.e., R2=120 Ohms) which (with the values C1=1.1 picoFarad and R1=100 Ohms) achieves 5% overshoot at each rising edge without significantly changing the acceptable rise and fall times and amount of rising edge overshoot.

Since the absolute magnitude of $I'_F$ flowing to the emitter of transistor Q1 (while the output falls) is less than the absolute magnitude of $I_F$ (while the output rises), the feedback circuitry of FIG. 3 provides relatively less feedback to the cascode amplifier stage at each rising edge of output OUT (than at each falling edge of output OUT), where the input is a square wave. More generally (for any variable input), the magnitude of each of $I_F$ and $I'_F$ varies with time in response to each increase or decrease in the input, but the average amplitude (i.e., the average absolute magnitude of the amplitude) of $I'_F$ flowing to the emitter of transistor Q1 (while the output rises by a first amount) is less than the average amplitude of $I_F$ (while the output rises by the same amount), so that the feedback circuitry of FIG. 3 provides relatively less feedback to the cascode amplifier stage while output OUT rises (than while output OUT falls. While the output falls, all of the feedback current $I_F$ which flows to capacitor C1 is from the cascode stage (after a brief time in which transistor Q5 turns off).

Figure 5:
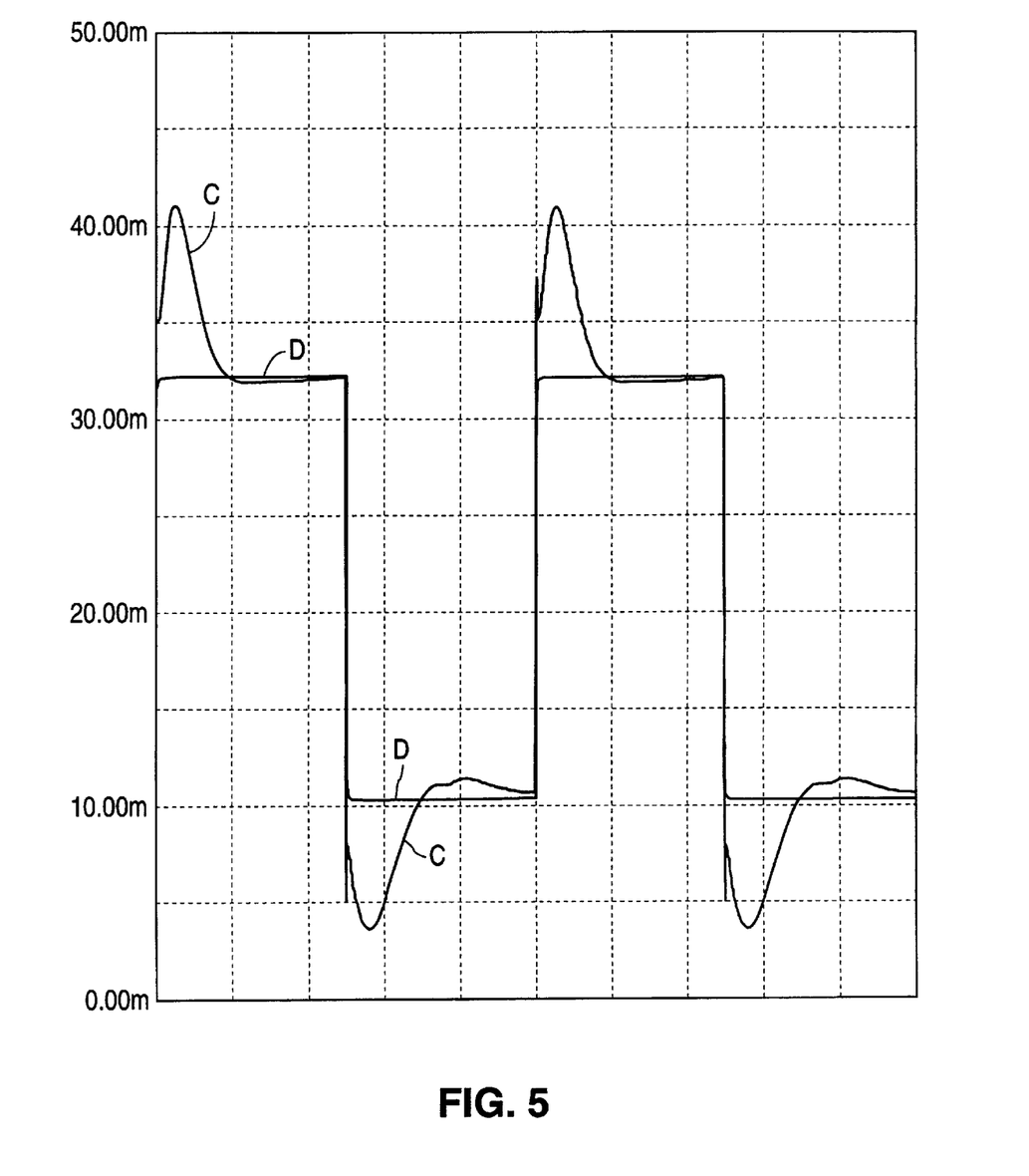
FIG. 5 is a graph of peak collector current of transistor Q2 in FIG. 1 (curve C), and in transistor Q2 of FIG. 3 (curve D), in response to a square wave input.

Another advantage of the FIG. 3 configuration (over that of FIG. 1) is that the relatively large feedback currents $I_F$ and $I'_F$ (which flow to and from the cascode amplifier stage of FIG. 3 at the rising and falling edges of the output) flow through cascode amplifier transistor Q1 only. In contrast, the feedback current $I_F$ (which flows to and from the cascode amplifier stage of FIG. 1 at the rising and falling edges of the output) flows through both of transistors Q1 and Q2. Thus, a lower bias voltage V2 can be used in the FIG. 3 circuit to bias Q1 (than in FIG. 1) before the onset of soft saturation effects in transistor Q2 due to the lower peak currents in transistor Q2. This is apparent from FIG. 5, in which curve C represents the collector current in transistor Q2 of FIG. 1 (in response to a square wave input IN) and curve D represents the collector current in transistor Q2 of FIG. 3 (in response to the same square wave input).

Figure 6:
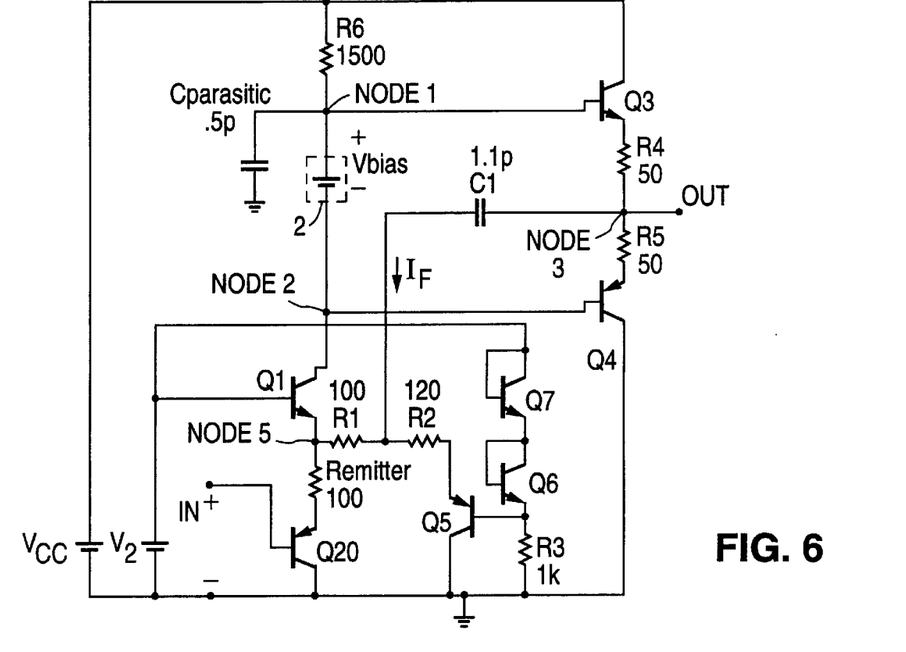
FIG. 6 is a schematic diagram of a cascode amplifier implemented in accordance with another preferred embodiment of the invention.

FIG. 6 is a schematic diagram of another preferred embodiment of the inventive cascode amplifier. The amplifier of FIG. 6 is identical to that of FIG. 3, except in that PNP bipolar transistor Q20 (connected between resistor $R_{emitter}$ and ground as shown) replaces NPN bipolar transistor Q2 of FIG. 3. In FIG. 6, resistor $R_{emitter}$ is connected between Node 5 and the emitter of transistor Q20, and the collector of Q20 is connected to ground. Transistor Q20 acts (in response to the input potential at its base) as a current source driving into transistor Q1 (as does transistor Q2 in FIG. 3).

Figure 7:
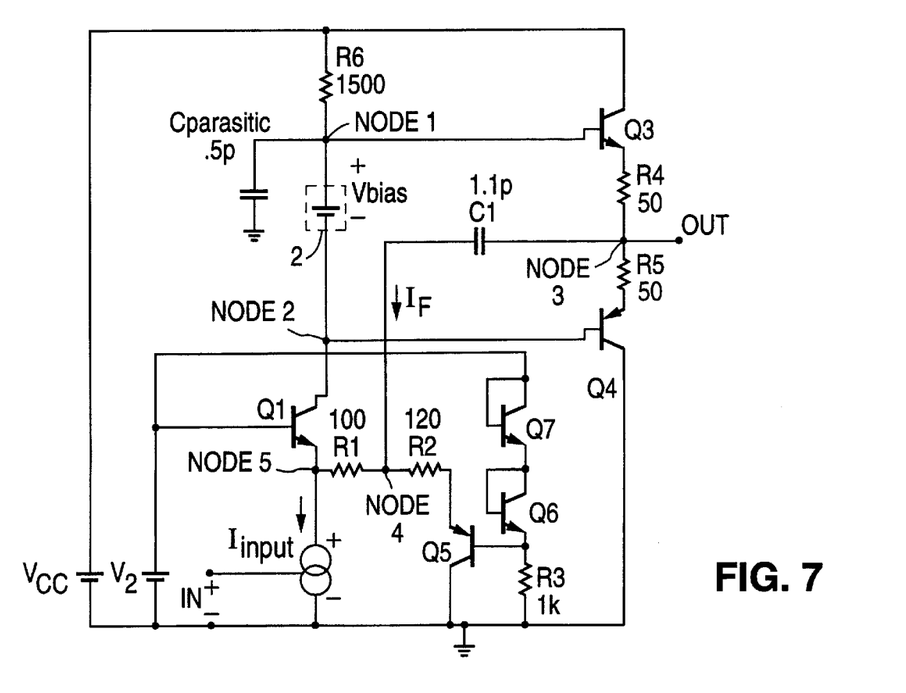
FIG. 7 is a schematic diagram of a cascode amplifier implemented in accordance with another embodiment of the invention.

Each of the FIG. 3 and FIG. 6 embodiments is a special case of the more generally specified embodiment shown in FIG. 7. The cascode amplifier of FIG. 7 is identical to that of FIG. 3 (and FIG. 6), except in that the input potential IN controls a current source (labeled as current source "$I_{input}$") which draws current $I_{input}$ from the emitter of transistor Q1. The amplitude of current $I_{input}$ varies in response to varying input potential IN. Current source $I_{input}$ can be implemented as a PNP bipolar transistor and resistor (as in FIG. 6), as an NPN bipolar transistor and resistor (as in FIG. 3), or in any of many other ways.

Figure 8:
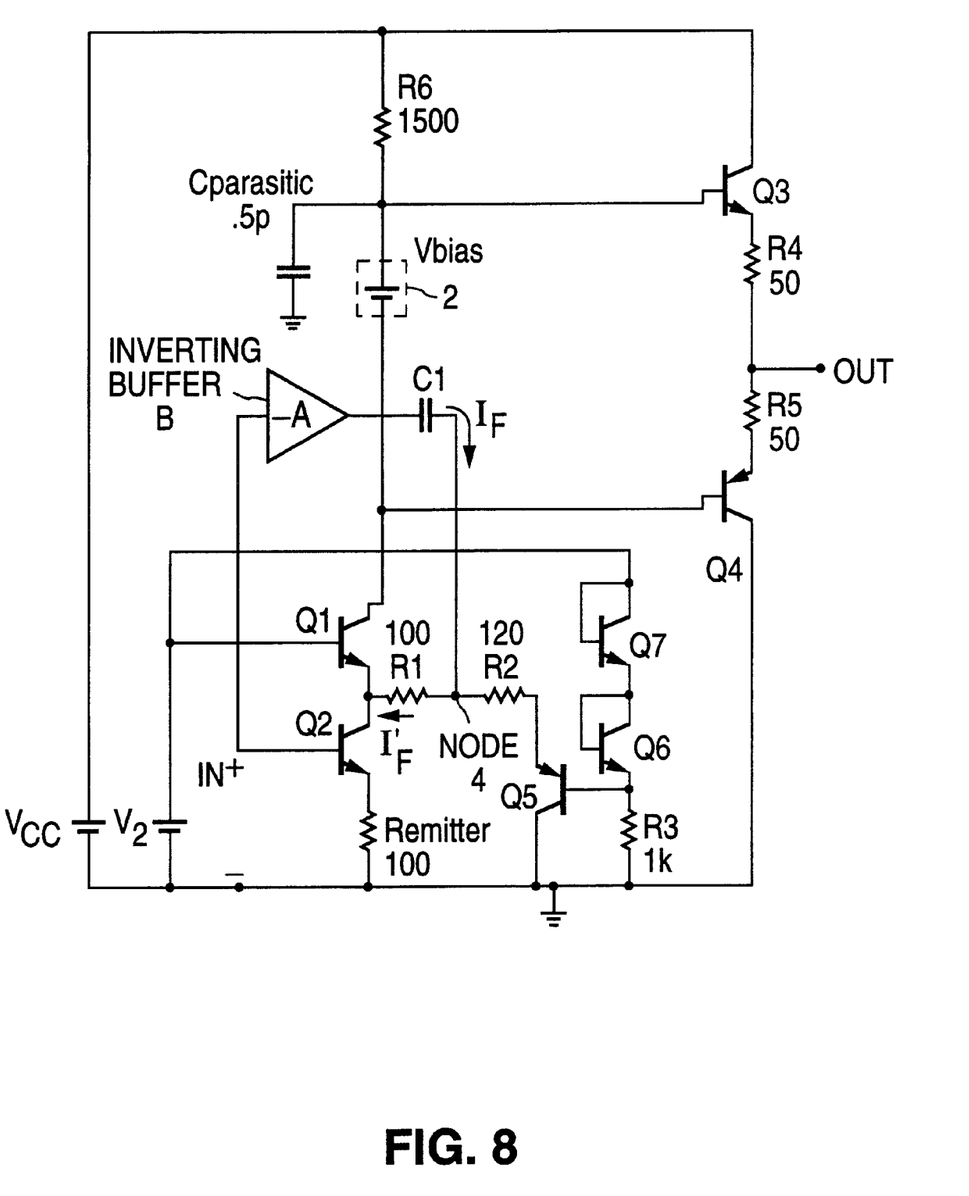
FIG. 8 is a schematic diagram of a cascode amplifier implemented in accordance with a third preferred embodiment of the invention.

FIG. 8 is a schematic diagram of a cascode amplifier implemented in accordance with another preferred embodiment of the invention. In the FIG. 8 embodiment of the inventive cascode amplifier, the cascode amplifier stage (comprising transistors Q1 and Q2, resistors R6 and $R_{emitter}$, and biasing circuitry for providing bias voltages $V_{bias}$ and $V_2$) is identical to that of FIG. 3, the output buffer stage (comprising transistors Q3 and Q4 and resistors R4 and R5) is identical to that of FIG. 3, but positive feedforward circuitry (comprising inverting buffer amplifier B, capacitor C1, resistors R1, R2, and R3, and transistors Q5, Q6, and Q7 connected as shown) replaces the feedback circuitry of FIG. 3. The feedforward circuitry provides improved amplifier response to a rapidly varying input IN. The input of buffer B is coupled to receive the input potential IN. Buffer B inverts the input potential and asserts the inverted input potential to one plate of capacitor C1. The other plate of capacitor C2 is coupled to Node 4 between resistors R1 and R2. As in the FIG. 3 embodiment, a falling potential at Node 4 reverse biases the emitter-base junction of transistor Q5 (so that no current flows through resistor R2), and also causes current (feedforward current $I_F$) to flow from the emitter of Q1 through resistor R1 to capacitor C1 (to discharge capacitor C1). The current $I_F$ represents provides a positive feedforward signal which increases the total current $I_C$ flowing into the collector of transistor Q1 (above the value it would have if R1 were replaced by an open circuit). The capacitance of capacitor C1 can be chosen (during design of a specific implementation of the FIG. 6 circuit) to optimize the strength of the feedforward signal, in order to minimize the fall time of output potential OUT and minimize the overshoot of each falling edge of output potential OUT.

In response to a decrease in the input potential IN of the FIG. 6 embodiment, the output potential OUT at Node 3 rises. At the same time, feedforward current $I_F$ flows from capacitor C1 to Node 4. A portion (feedback current $I'_F$) of current $I_F$ flows from Node 4 through resistor R1 to the emitter of transistor Q1. The remaining portion of current $I_F$ flows from Node 4 through resistor R2 and transistor Q5 to ground. The current $I'_F$ is a positive feedforward signal which decreases the total current $I_C$ flowing into the collector of Q1 (below the value it would have if R1 were replaced by an open circuit). Depending on the value of the resistance ratio R1/R2 of FIG. 6, more or less of current $I_F$ is steered away from the cascode amplifier stage (at each rising edge of the output potential OUT).

Another aspect of the invention is a method for operating an amplifier configured to provide positive feedback from an output node to a cascode amplifier stage to improve the amplifier's response to a rapidly varying input, including the steps of: providing relatively less positive feedback to the cascode amplifier stage while the output potential at the output node increases; and providing relatively more positive feedback to the cascode amplifier stage while the output potential at the output node decreases. In preferred embodiments, the feedback is provided in such a manner that the overshoot of the output potential in response to a rising edge of the input is at least substantially equal to the overshoot of the output signal in response to a falling edge of the input.

Another aspect of the invention is a method for designing an amplifier to have optimized response to a rapidly varying input, wherein the amplifier has feedback circuitry connected between an output node and a cascode amplifier stage, and the feedback circuitry includes a capacitor coupled to the output node, a first branch coupled between the capacitor and the cascode amplifier stage, and a second branch having a first state in which it steers current from the first branch and a second state in which it does not steer current from the first branch. This method includes the steps of: determining a capacitance of the capacitor, parameters of the first branch, and candidate parameters of the second branch which result in predetermined (acceptably small) rise times and fall times of the output potential (in response to falling and rising edges of the input) with no more than a predetermined (acceptably small) overshoot at each falling edge of the output potential; and (assuming that the feedback circuit is implemented with the capacitor having said capacitance and the first branch having said parameters) determining parameters of the second branch which cause the feedback circuitry produce no more than said acceptably small overshoot at each rising edge of the output potential.

Another aspect of the invention is a method for operating an amplifier in which positive feedforward (a positive feedforward signal) is provided from an input node to a cascode amplifier stage to improve the amplifier response to a rapidly varying input, wherein relatively less positive feedforward is provided to the cascode amplifier stage while the output potential at the output node increases, and relatively more positive feedforward is provided to the cascode amplifier stage while the output potential at the output node decreases. In preferred embodiments, the feedforward is a feedforward current which flows to or from a capacitor coupled (through an inverting buffer) to the input node, part of this current is steered away from the cascode amplifier stage (and the remaining portion is steered to the cascode amplifier stage) while the output rises, and no part of the feedforward current is steered away from the cascode amplifier stage while the output falls, so that the overshoot of the output potential in response to a rising edge of the input is equal or substantially equal to the overshoot of the output potential in response to a falling edge of the input.

Another aspect of the invention is a method for designing an amplifier to have optimized response to a rapidly varying input, where the amplifier includes feedforward circuitry connected between an input node and a cascode amplifier stage, the feedforward circuitry including a capacitor branch (e.g., capacitor C1 and buffer B of FIG. 8) coupled to the input node, a first branch coupled between the capacitor branch and the cascode amplifier stage, and a second branch having a first state in which it steers current from the first branch and a second state in which it does not steer current from the first branch. This method includes the steps of: determining a capacitance of the capacitor branch, parameters of the first branch, and candidate parameters of the second branch which result in predetermined (acceptably small) rise times and fall times of the output potential (in response to falling and rising edges of the input) with no more than a predetermined (acceptably small) overshoot at each falling edge of the output potential; and (assuming that the feedforward circuit is implemented with the capacitor branch having said capacitance and the first branch having said parameters) determining parameters of the second branch which cause the feedforward circuitry produce no more than said acceptably small overshoot at each rising edge of the output potential.

Although only preferred embodiments have been described in detail (and alternative embodiments have also been described), those having ordinary skill in the art will appreciate that many modifications are possible without departing from the teachings set forth herein. All such modifications are intended to be encompassed within the following claims.

What is claimed is:

1. An amplifier, comprising:
a cascode amplifier stage coupled to receive an input at an input node;
an output node coupled to the cascode amplifier stage node, wherein the amplifier is configured to assert an output potential at the output node in response to the input; and
feedforward circuitry coupled between the input node and the cascode amplifier stage, wherein the feedforward circuitry is configured to provide a positive feedforward signal to the cascode amplifier stage while the output potential decreases, and to provide relatively less positive feedforward to the cascode amplifier stage while the output potential increases, wherein the feedforward circuitry is configured to cause rise times and fall times of the output potential in response to changes in the input to be within predetermined limits, with no more than a predetermined amount of overshoot at each rising edge and each falling edge of the output potential, and with at least substantially equal overshoot at said each rising edge and said each falling edge of the output potential.

2. The amplifier of claim 1, wherein the amplifier is a high-speed cascode amplifier implemented as an integrated circuit.

3. An amplifier, comprising:
a cascode amplifier stage coupled to receive an input at an input node;
an output node coupled to the cascode amplifier stage node, wherein the amplifier is configured to assert an output potential at the output node in response to the input; and
feedforward circuitry coupled between the input node and the cascode amplifier stage, wherein the feedforward circuitry is configured to provide a positive feedforward signal to the cascode amplifier stage while the output potential decreases, and to provide relatively less positive feedforward to the cascode amplifier stage while the output potential increases, wherein the feedforward circuitry is configured to provide a feedforward current to the cascode amplifier stage in response to changes of the input, wherein the feedforward current during a decrease by a first amount of the output potential has a first average amplitude, and the feedforward current during an increase by the first amount of said output potential has a second average amplitude, wherein the second average amplitude is less than the first average amplitude.

4. An amplifier, comprising:
a cascode amplifier stage coupled to receive an input at an input node;
an output node coupled to the cascode amplifier stage node, wherein the amplifier is configured to assert an output potential at the output node in response to the input; and
feedforward circuitry coupled between the input node and the cascode amplifier stage, wherein the feedforward circuitry is configured to provide a positive feedforward signal to the cascode amplifier stage while the output potential decreases, and to provide relatively less positive feedforward to the cascode amplifier stage while the output potential increases, wherein the feedforward circuitry is configured to provide a feedforward current to the cascode amplifier stage in response to changes of the input, wherein the feedforward current during a decrease by a first amount of the output potential has a first average amplitude, and the feedforward current during an increase by the first amount of said output potential has a second average amplitude, wherein the second average amplitude is less than the first average amplitude, and wherein the feedforward circuitry includes:
a buffer amplifier having an input terminal coupled to the input node and an output terminal;
a capacitor coupled to the output terminal of the buffer amplifier;
a first branch coupled between the capacitor and the cascode amplifier stage, wherein the feedforward current flows through the first branch; and
a second branch having a first state and a second state, wherein the second branch in the first state steers current received from the capacitor away from the first branch, and wherein there is no significant current flow between the capacitor and the second branch in the second state.

5. An amplifier, comprising:
a cascode amplifier stage coupled to receive an input at an input node;
an output node coupled to the cascode amplifier stage node, wherein the amplifier is configured to assert an output potential at the output node in response to the input; and
feedforward circuitry coupled between the input node and the cascode amplifier stage, wherein the feedforward circuitry is configured to provide a positive feedforward signal to the cascode amplifier stage while the output potential decreases, and to provide relatively less positive feedforward to the cascode amplifier stage while the output potential increases, wherein the feedforward circuitry is configured to provide a feedforward current to the cascode amplifier stage in response to changes of the input, wherein the feedforward current during a decrease by a first amount of the output potential has a first average amplitude, and the feedforward current during an increase by the first amount of said output potential has a second average amplitude, wherein the second average amplitude is less than the first average amplitude, and wherein the feedforward circuitry includes:

a buffer amplifier having an input terminal coupled to the input node and an output terminal;

a capacitor coupled to the output terminal of the buffer amplifier;

a first resistor coupled between the capacitor and the cascode amplifier stage, wherein the feedforward current flows through said first resistor; and a second branch comprising a second resistor and a bipolar transistor, wherein the second resistor is coupled to the first resistor at a first node, the bipolar transistor has a channel connected in series with the second resistor, and the bipolar transistor is biased such that falling potential at the first node reverse biases an emitter-base junction of said bipolar transistor so that no significant current flows through the second resistor between the first node and the channel of said bipolar transistor, but such that current from the capacitor is steered through the second resistor away from the first resistor in response to rising potential at the first node.

6. An amplifier, comprising:

a cascode amplifier stage coupled to receive an input at an input node;

an output node coupled to the cascode amplifier stage node, wherein the amplifier is configured to assert an output potential at the output node in response to the input;

feedforward circuitry coupled between the input node and the cascode amplifier stage, wherein the feedforward circuitry is configured to provide a positive feedforward signal to the cascode amplifier stage while the output potential decreases, and to provide relatively less positive feedforward to the cascode amplifier stage while the output potential increases; and an output stage coupled between the output node and the cascode amplifier stage.

7. A method for operating an amplifier having a cascode amplifier stage coupled to receive an input at an input node, wherein the amplifier is configured to assert an output potential at an output node in response to the input and to provide feedforward from the input node to the cascode amplifier stage to improve amplifier response to rapid variations in the input, said method including the steps of:

(a) providing relatively less positive feedforward to the cascode amplifier stage while the output potential at the output node increases; and (b) providing relatively more positive feedforward to the cascode amplifier stage while the output potential at the output node decreases.

8. A method for operating an amplifier having a cascode amplifier stage coupled to receive an input at an input node, wherein the amplifier is configured to assert an output potential at an output node in response to the input and to provide feedforward from the input node to the cascode amplifier stage to improve amplifier response to rapid variations in the input, said method including the steps of:

(a) providing relatively less positive feedforward to the cascode amplifier stage while the output potential at the output node increases; and (b) providing relatively more positive feedforward to the cascode amplifier stage while the output potential at the output node decreases, wherein the amplifier includes a buffer amplifier having an input terminal coupled to the input node and an output terminal, and a capacitor coupled to the output terminal of the buffer amplifier, wherein step (a) includes the step of while current flows from the capacitor toward the cascode amplifier stage, allowing a feedforward portion of the current to flow to the cascode amplifier stage while steering away another portion of said current away from the cascode amplifier stage, and wherein step (b) includes the step of causing feedforward current to flow from the cascode amplifier stage to the capacitor.

9. The method of claim 8, wherein the feedforward portion of the current is selected such that overshoot of the output potential in response to a rising edge of the input is at least substantially equal to overshoot of the output potential in response to a falling edge of the input.

10. A method for designing an amplifier to have optimized response to a rapidly varying input, wherein the amplifier produces an output potential at an output node, the amplifier includes a cascode amplifier stage and feedforward circuitry connected between the input node and the cascode amplifier stage, and the feedforward circuitry includes a buffer amplifier having an input terminal coupled to the input node and an output terminal, a capacitor coupled to the output terminal of the buffer amplifier, a first branch coupled between the capacitor and the cascode amplifier stage, and a second branch having a first state in which it steers current from the first branch and a second state in which it does not steer current from the first branch, said method including the steps of:

(a) determining a capacitance of the capacitor, parameters of the first branch, and candidate parameters of the second branch which result in rise times and fall times of the output potential in response to changes in a high frequency, square wave input which are within predetermined limits, with no more than a predetermined amount of overshoot at each falling edge of the output potential produced in response to the square wave input; and (b) for an implementation of the feedforward circuit with the capacitor having said capacitance and the first branch having said parameters, determining optimized parameters of the second branch which cause the feedforward circuitry to produce no more than said predetermined amount of overshoot at each rising edge of the output potential produced in response to the square wave input.

11. The method of claim 10, wherein step (b) includes the step of determining the optimized parameters of the second branch such that said optimized parameters cause the feedforward circuitry to produce no more than said predetermined amount of overshoot at said each rising edge of the output potential, with at least substantially equal overshoot at said each rising edge and said each falling edge of the output potential produced in response to the square wave input.

* * * * *

UNITED STATES PATENT AND TRADEMARK OFFICE
CERTIFICATE OF CORRECTION

PATENT NO.: 6,163,211
DATED: December 19, 2000
INVENTOR: ANDREW J. MORRISH

It is certified that an error appears in the above-identified patent and that said Letters Patent is hereby corrected as shown below:

Please correct the text in the title:

[54] CASCODE AMPLIFIER WITH POSITIVE FEEDFORWARD FOR HIGH FREQUENCY PERFORMANCE AND METHOD FOR OPERATING AND OPTIMIZING SUCH AMPLIFIER

Signed and Sealed this

First Day of May, 2001

Attest:

NICHOLAS P. GODICI

*Attesting Officer*  *Acting Director of the United States Patent and Trademark Office*